(12) United States Patent
Fulford et al.

(10) Patent No.: US 12,001,147 B2
(45) Date of Patent: Jun. 4, 2024

(54) PRECISION MULTI-AXIS PHOTOLITHOGRAPHY ALIGNMENT CORRECTION USING STRESSOR FILM

(71) Applicant: Tokyo Electron Limited, Tokyo (JP)

(72) Inventors: Daniel J. Fulford, Ballston Lake, NY (US); Anthony R. Schepis, Averill Park, NY (US); Mark I. Gardner, Cedar Creek, TX (US); Anton J. Devilliers, Clifton Park, NY (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/888,553

(22) Filed: Aug. 16, 2022

(65) Prior Publication Data
US 2023/0161267 A1    May 25, 2023

Related U.S. Application Data

(60) Provisional application No. 63/281,431, filed on Nov. 19, 2021.

(51) Int. Cl.
*G03F 7/20* (2006.01)
*G03F 7/00* (2006.01)

(52) U.S. Cl.
CPC ...... *G03F 7/70633* (2013.01); *G03F 7/70625* (2013.01)

(58) Field of Classification Search
CPC ............ G03F 7/70633; G03F 7/70625; G03F 7/70525; G03F 7/70783; H01L 21/6875; H01L 22/30; H01L 21/302; H01L 21/6715; H01L 21/67115; H01L 22/12; H01L 21/027; H01L 21/67288; H01L 22/20; H01L 21/0274; G06F 30/20; G06F 30/23; G06T 2207/30148; G06T 7/0004
See application file for complete search history.

(56) References Cited

U.S. PATENT DOCUMENTS

| | | |
|---|---|---|
| 9,824,894 B2 | 11/2017 | De Villiers |
| 9,842,879 B2 | 12/2017 | Matsugai |
| 10,157,747 B2 | 12/2018 | De Villiers |

(Continued)

FOREIGN PATENT DOCUMENTS

CN    110620057 A    12/2019

OTHER PUBLICATIONS

International Search Report and written Opinion dated Mar. 15, 2023 in PCT/US2022/048920, 8 pages.

*Primary Examiner* — Mesfin T Asfaw
(74) *Attorney, Agent, or Firm* — Oblon, McClelland, Maier & Neustadt, L.L.P.

(57) ABSTRACT

Aspects of the present disclosure provide a method for improving overlay alignment of patterning by correcting wafer shape. For example, the method can include receiving a wafer having a working surface with at least partially-fabricated semiconductor devices, and a backside surface opposite to the working surface. The method can also include forming a first stressor film on the backside surface. The first stressor film can modify overlay alignment of the working surface in a first direction across the working surface of the wafer. The method can also include forming one or more first semiconductor structures on the working surface of the wafer. The first semiconductor structures are aligned in the first direction.

7 Claims, 12 Drawing Sheets

(56) References Cited

U.S. PATENT DOCUMENTS

| | | | |
|---|---|---|---|
| 10,355,042 | B2 | 7/2019 | Matsugai |
| 10,431,468 | B2 | 10/2019 | De Villiers et al. |
| 10,453,692 | B2 | 10/2019 | De Villiers et al. |
| 10,475,657 | B2 | 11/2019 | De Villiers |
| 10,622,233 | B2 | 4/2020 | Hooge et al. |
| 10,763,431 | B2 | 9/2020 | Ok et al. |
| 10,811,265 | B2 | 10/2020 | De Villiers |
| 10,854,667 | B2 | 12/2020 | Matsugai |
| 2015/0294917 | A1 | 10/2015 | De Villiers |
| 2018/0068860 | A1 | 3/2018 | De Villiers et al. |
| 2018/0068861 | A1* | 3/2018 | deVilliers ........... G03F 7/70783 |
| 2019/0355780 | A1 | 11/2019 | Matsugai |
| 2020/0161547 | A1 | 5/2020 | Ok et al. |

* cited by examiner

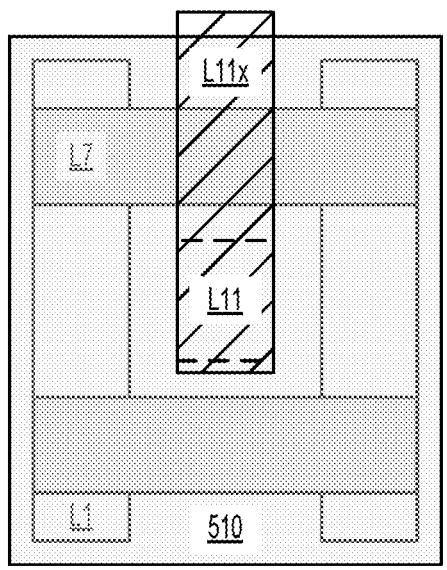
FIG. 5A
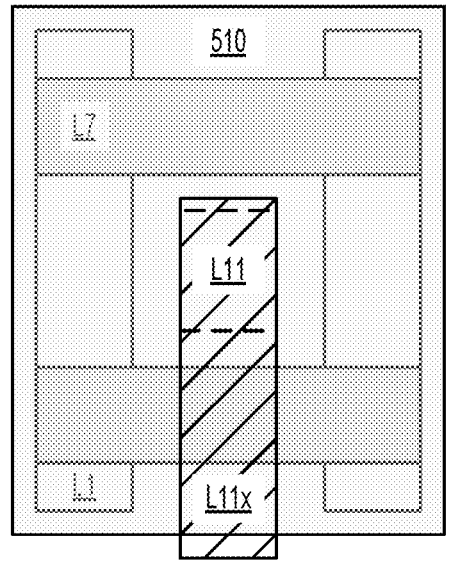
FIG. 5B
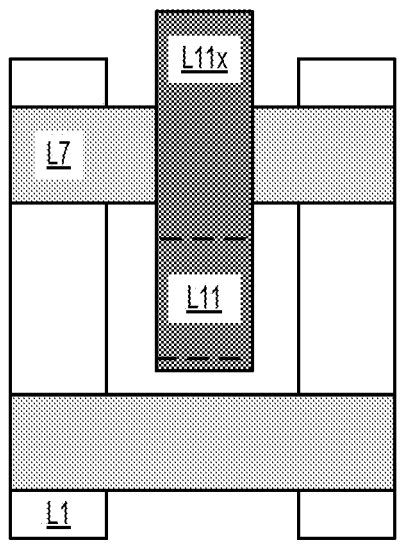
FIG. 5C
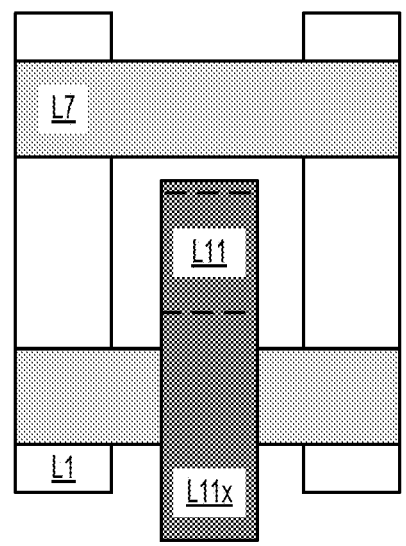
FIG. 5D
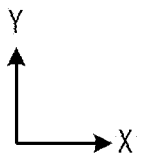

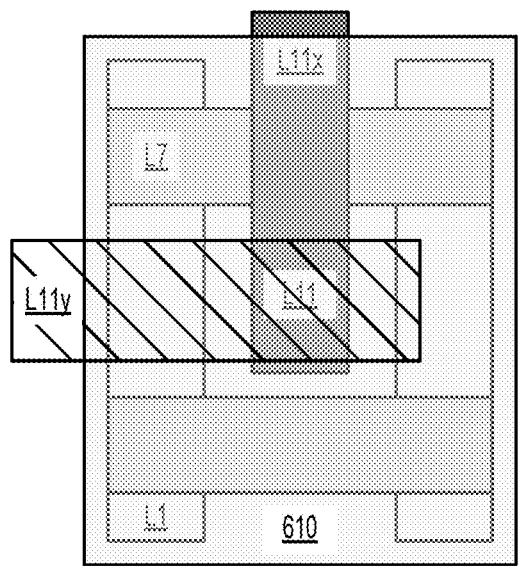
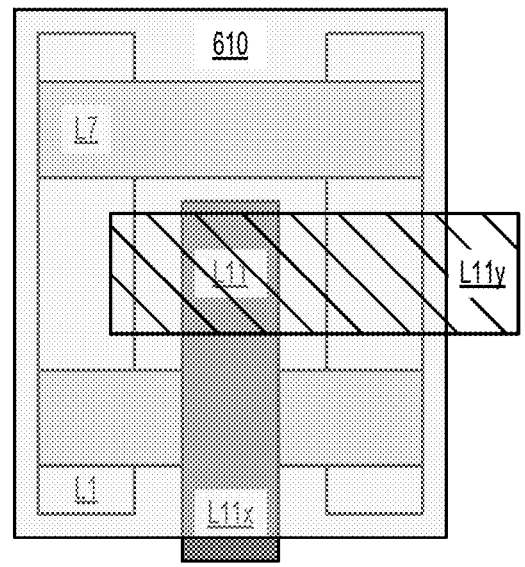
FIG. 6A
FIG. 6B
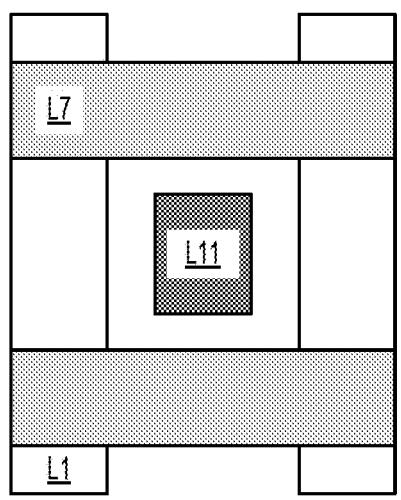
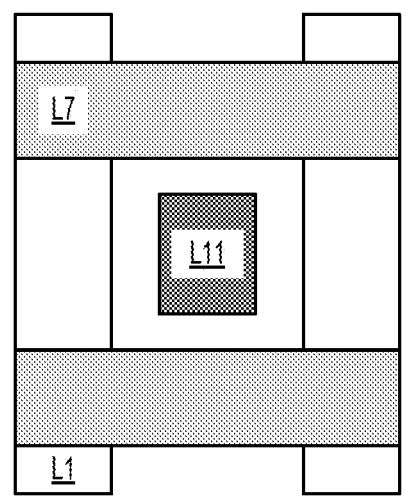
FIG. 6C
FIG. 6D

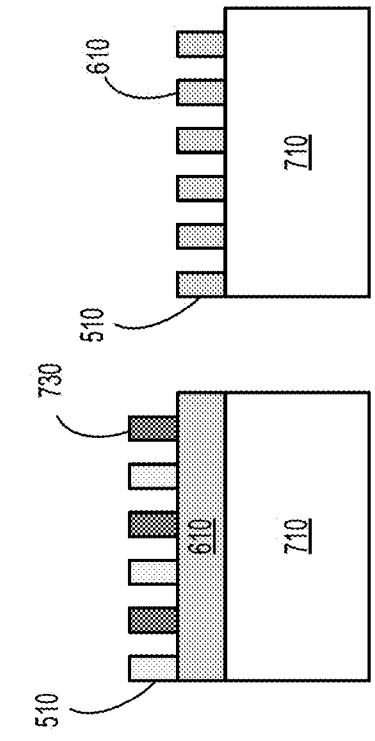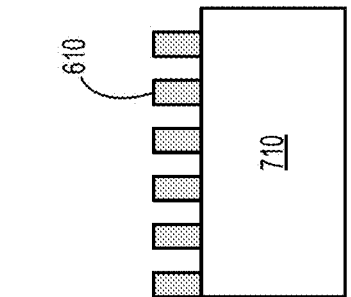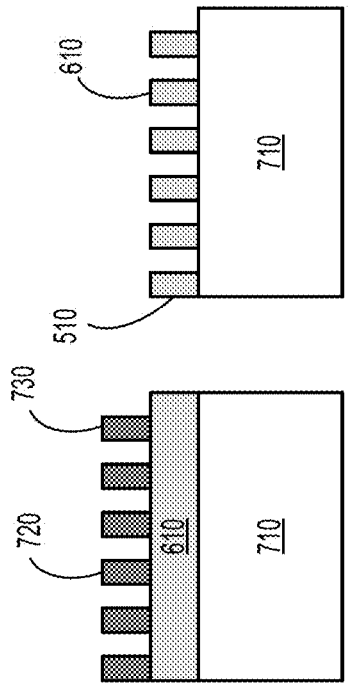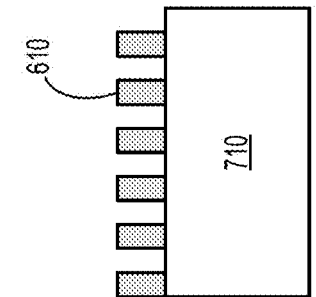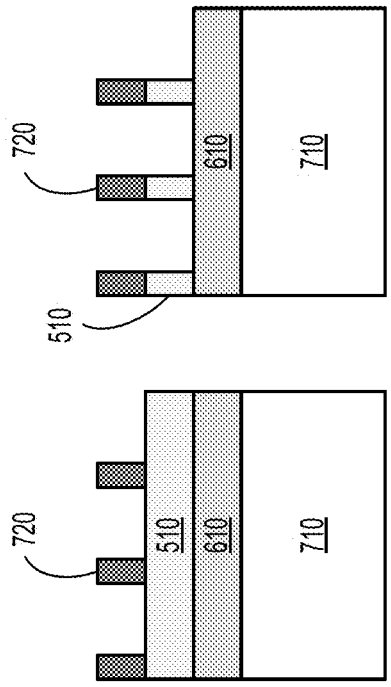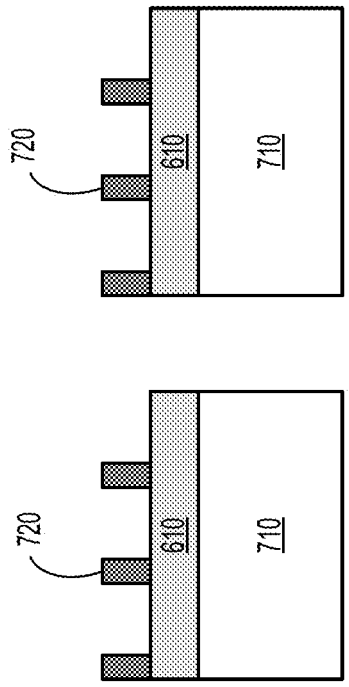

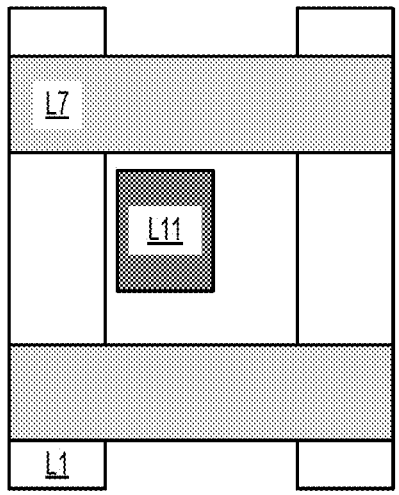
*FIG. 12A*
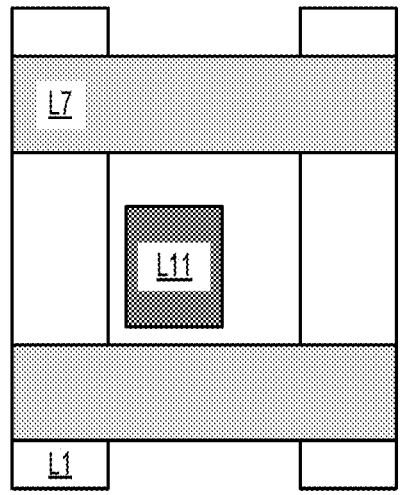
*FIG.12B*
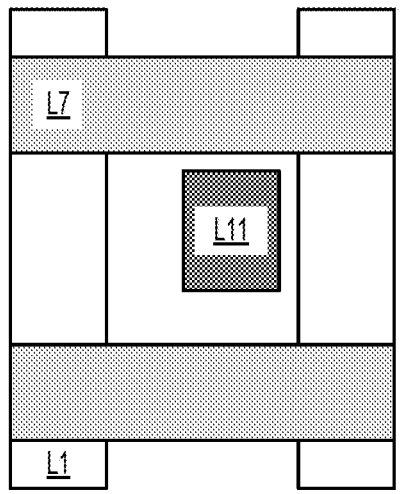
*FIG. 12C*
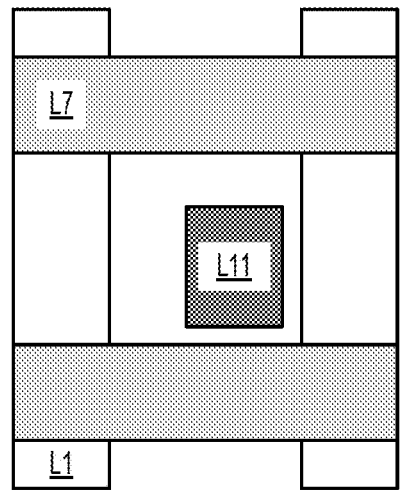
*FIG. 12D*
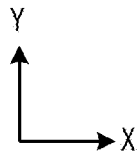

PRECISION MULTI-AXIS PHOTOLITHOGRAPHY ALIGNMENT CORRECTION USING STRESSOR FILM

INCORPORATION BY REFERENCE

This present disclosure claims the benefit of U.S. Provisional Application No. 63/281,431, "Precision Multi-Axis Photolithography Alignment Correction Using Stressor Film" filed on Nov. 19, 2021, which is incorporated herein by reference in its entirety.

FIELD OF THE INVENTION

The present disclosure relates to semiconductor fabrication, and more particularly, to wafer curvature, bow and overall wafer shape.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

Aspects of the present disclosure provide a method for improving overlay alignment of patterning by correcting wafer shape. For example, the method can include receiving a wafer having a working surface with at least partially-fabricated semiconductor devices, and a backside surface opposite to the working surface. The method can also include forming a first stressor film on the backside surface. The first stressor film can modify overlay alignment of the working surface in a first direction across the working surface of the wafer, and include no overlay alignment in a second direction across the working surface of the wafer. The second direction is different than the first direction. The method can also include forming one or more first semiconductor structures on the working surface of the wafer. The first semiconductor structures are aligned in the first direction.

In an embodiment, the second direction can be rotated at least 15 degrees relative to the first direction. For example, the second direction can be rotated 45 degrees relative to the first direction. As another example, the second direction can be orthogonal to the first direction.

In an embodiment, the method can further include subsequent to forming the first semiconductor structures on the working surface of the wafer, forming a second stressor film on the backside surface, the second stressor film modifying overlay alignment of the working surface in the second direction across the working surface of the wafer, and forming one or more second semiconductor structures on the working surface of the wafer, the second semiconductor structures aligned in the second direction. In another embodiment, the method can further include subsequent to forming the first semiconductor structures on the working surface of the wafer, forming a second stressor film on the backside surface, the second stressor film modifying overlay alignment of the working surface in the second direction across the working surface of the wafer, and modifying the first semiconductor structures on the working surface of the wafer, the modified first semiconductor structures aligned in the second direction. In yet another embodiment, the method can further include prior to forming the first semiconductor structures on the working surface of the wafer, forming a second stressor film on the backside surface, the second stressor film modifying overlay alignment of the working surface in the second direction across the working surface of the wafer; and subsequent to forming the first semiconductor structures on the working surface of the wafer, modifying the first semiconductor structures on the working surface of the wafer, the modified first semiconductor structures aligned in the second direction. For example, the first stressor film and the second stressor film are formed in a litho-etch-litho-etch (LELE) process or a litho-freeze-litho-etch (LEFE) process.

In an embodiment, the first stressor film can be patterned based on a bow measurement of the wafer in the first direction. For example, the first stressor film can be patterned using direct write patterning.

Aspects of the present disclosure also provide another method for improving overlay alignment of patterning by correcting wafer shape. For example, the method can include receiving a wafer having a working surface with at least partially-fabricated semiconductor devices, and a backside surface opposite to the working surface. The method can also include forming a stressor film on the backside surface. The stressor film can modify overlay alignment of the working surface in first and second directions across the working surface of the wafer. The method can also include forming one or more semiconductor structures on the working surface of the wafer. The semiconductor structures are aligned in the first and second directions.

In an embodiment, the stressor film can be patterned based on bow measurements of the wafer in the first and second directions. In another embodiment, the stressor film can be patterned based on $\alpha$ times of a bow measurement of the wafer in the first direction and $(1-\alpha)$ times of a bow measurement of the wafer in the second direction, where $0 \leq \alpha \leq 1$. For example, $\alpha$ is $\frac{1}{2}$.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 5A to 5D illustrate modifying overlay alignment of a working surface of a wafer in a first direction in accordance with some embodiments of the present disclosure;

FIGS. 6A to 6D illustrate modifying overlay alignment of the working surface of the wafer shown in FIGS. 5A to 5D in a second direction in accordance with some embodiments of the present disclosure;

FIGS. 7A to 7D illustrate a litho-etch-litho-etch (LELE) process used in accordance with some embodiments of the present disclosure;

FIGS. 8A to 8D illustrate a litho-freeze-litho-etch (LFLE) process used in accordance with some embodiments of the present disclosure;

FIGS. 12A to 12D illustrate an example result of average X and Y correction in accordance with some embodiments of the present disclosure.

DETAILED DESCRIPTION

Semiconductor fabrication development now incorporates techniques such as advanced patterning and 3D device construction to reduce feature size and increase device density. The implementation of these techniques, however, has created new challenges for successful micro fabrication. These new fabrication approaches include the creation of multiple layers of film of various materials, on the wafer surface. Each layer, however, adds additional stress to the surface of the wafer. As the layers of film build up, the induced stress distorts the flatness of the wafer. This distortion has been shown to reduce the size uniformity of critical features across the surface of the wafer.

This distortion also results in overlay errors and challenges. Various fabrication process steps can cause expansion and/or contraction of the substrate, resulting is a warped or bowed substrate. For example, during exposure a substrate is heated locally due to the energy transferred to the substrate from an exposure beam. Substrates are also heated during anneal processes. This heating causes the substrate to expand. If the substrate expansion is unchecked, the expansion exceeds overlay error requirements. Moreover, if the clamping force between the substrate and the substrate chuck is insufficient to prevent substrate expansion, then the substrate can slip on the substrate chuck and larger substrate expansion will occur, resulting in larger overlay errors. Slipping can be more pronounced in some processes, such as in extreme ultraviolet (EUV) systems, because the environment surrounding the substrate during exposure is a vacuum. Thus, vacuum clamping is not always possible, and the weaker electrostatic clamping must be used in lieu of a vacuum clamp.

Other fabrication steps can also cause substrate expansion and contraction. For example, deposited films can cause substrate contraction. Also, various annealing and doping steps can create substantial amounts of bow in a given substrate. Annealing steps can especially create overlay challenges. The result of these various fabrication steps is a substrate that is uneven or non-planar. For example, a backside of the substrate can have z-height variations (i.e., variations in vertical heights) that have both high spots and low spots. Z-height variations due to such bowing can be on the order of about a micron to approximately 100 microns. This fluctuation is significant because semiconductor devices or structures being exposed by various exposure tools are being exposed on scales of tens of nanometers to hundreds of nanometers. Thus having deflection variations of thousands of nanometers to 10,000 nanometers can dramatically reduce yield.

Figure 1:
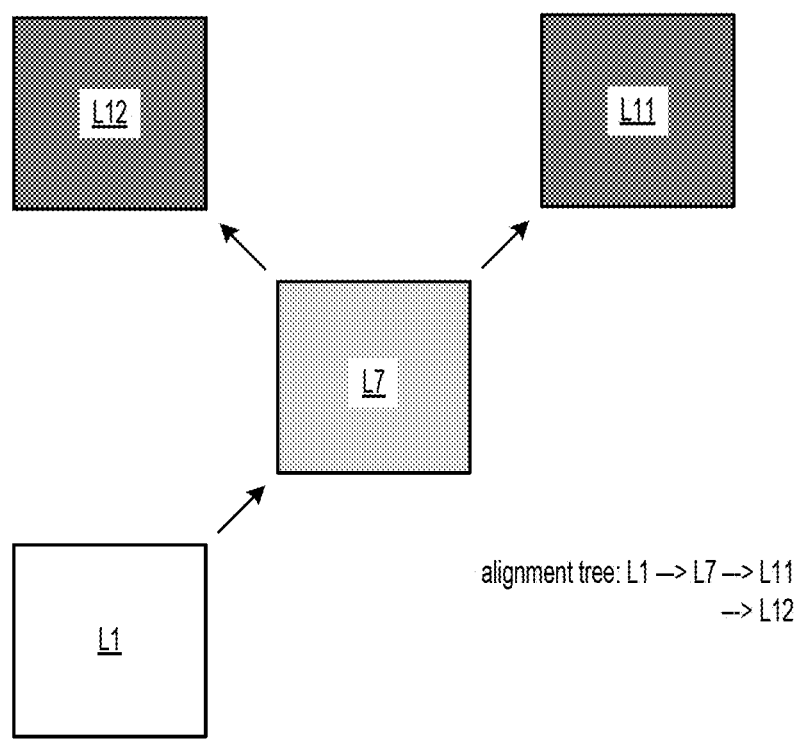
FIG. 1 is a diagram showing an alignment tree that is prepared before photo masks are produced.
Figure 2A:
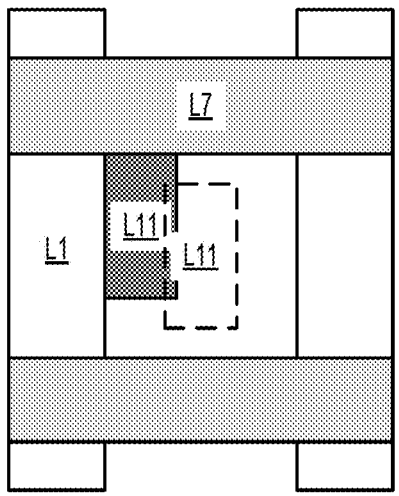
FIGS. 2A to 2D show an example of an overlay patterning error.
Figure 2B:
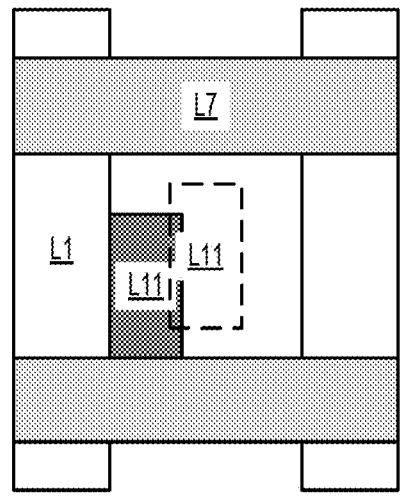
Figure 2C:
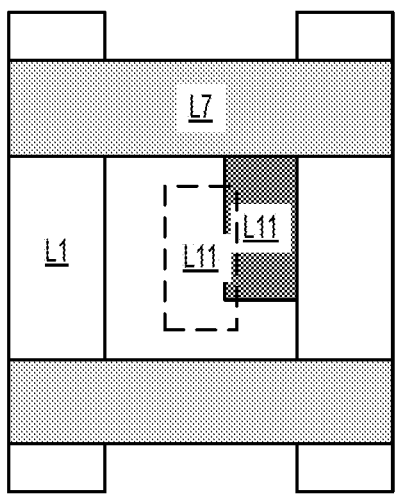
Figure 2D:
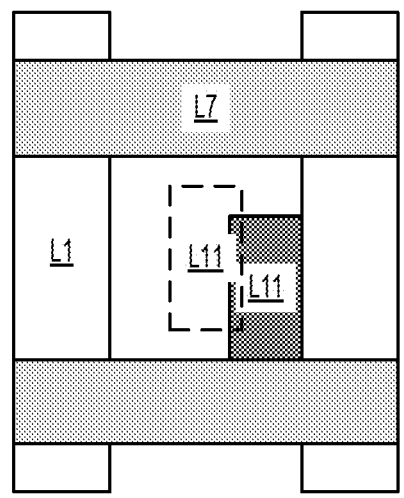

FIG. 1 is a diagram showing an alignment tree 100 that is prepared before photo masks are produced. In the alignment tree 100, a layer L7 is aligned, using an alignment mark of a layer L1, and layers L11 and L12 are aligned, using an alignment mark of the layer L7. The layer L7 is aligned to the layer L1 directly, and the layers L11 and L12 are aligned to the layer L1 indirectly. The layers L1, L7, L11 and L12 can be transistors, fins, metal layer, masks, or any other sacrificial or final structure on a wafer formed during microfabrication. Walkout of successive layers may occur. With unavoidable stresses induced on layers during microfabrication processes, successive layers can become progressively misaligned to each other and to starting layers.

Microfabrication causes stresses on a wafer due to various materials deposition, removal, annealing, etching, and so forth. Because of the process stress on the wafer some of the possible wafer bows are the Zernike Polynomials, including vertical tile, horizontal tilt, oblique astigmatism, defocus, etc. FIGS. 2A to 2D show an example of an overlay patterning error. There are many different patterns of wafer bow and curvature. This particular example shows oblique astigmatism, with the result that a layer L11 has misalignment in both X and Y direction and to various degrees (the dashed line shows where the layer L11 is desired to be placed, and the solid line shows where the layer L11 is actually placed due to the wafer bow).

Conventional techniques used to address substrate bow and uneven curvature on partially-processed substrates focus on chucking techniques to chuck (or clamp/suck) a substrate to a substrate holder to flatten curvature. With relatively significant bowing, however, it can be very difficult or impossible to accurately flatten a substrate by chucking alone. Thus, it is desirable to have a substrate bow correction technique to correct substrate bow and improve overlay prior to being sent or returned to a scanner for additional exposures.

Techniques herein include methods of improving overlay alignment of patterning by correcting wafer shape or correcting wafer bow and curvature, in order to more accurately print patterns on a wafer. Techniques herein include single axis or single direction alignment or correction followed by secondary alignment or correction in a different axis or direction. Such incremental multi-axis correction can provide greater accuracy compared to correcting bow for all directions at once. Accordingly, techniques herein correct alignment in separate directions incrementally or successively. Techniques also include correction in one direction without correction in another direction, typically orthogonal.

Techniques disclosed herein use stressor films on a backside surface of a wafer. Certain embodiments use only direct write laser treatment for modification of a stress value to create optimum wafer shape using a wafer shape correction tool. Such stress correction tools are configured to modify a wafer shape (wafer bow, wafer curvature) to improve overlay. One technique is to deposit one or more stressor films on a backside surface of a wafer. The one or more stressor films can have different initial internal stresses. The stressor films can be patterned and then etched to selectively increase/decrease stresses at given point locations across the backside surface, thereby modifying wafer shape, which can improve overlay values. Patterning can be executed using direct-write laser exposure. Direct write patterning is beneficial because patterns can be created by software and laser control intensity at each coordinate location on a wafer based on a wafer shape signature or a wafer bow measurement. Thus, exposure patterns can easily change wafer to wafer. Of course, mask-based exposure is also contemplated. A given stressor film herein can be removed in selective regions of the backside surface as an option. Stressor films herein can be reset and be kept in place or removed. Stressor films herein can be a single layer or N layers. Stressor films herein can be modified between X and Y directions, or multi-axis photolithography alignment corrections.

Figure 3A:
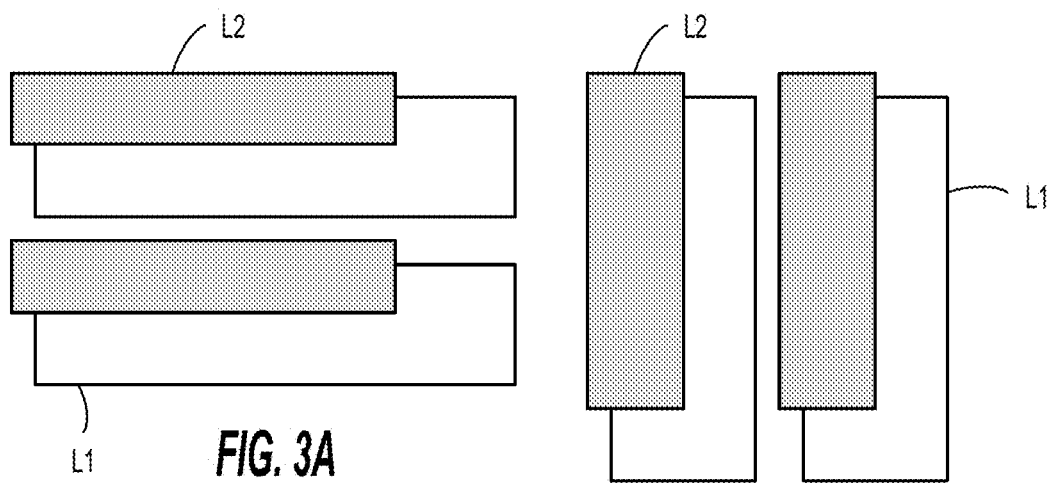
FIG. 3A illustrates alignment of two layers without wafer stress correction.
Figure 3B:
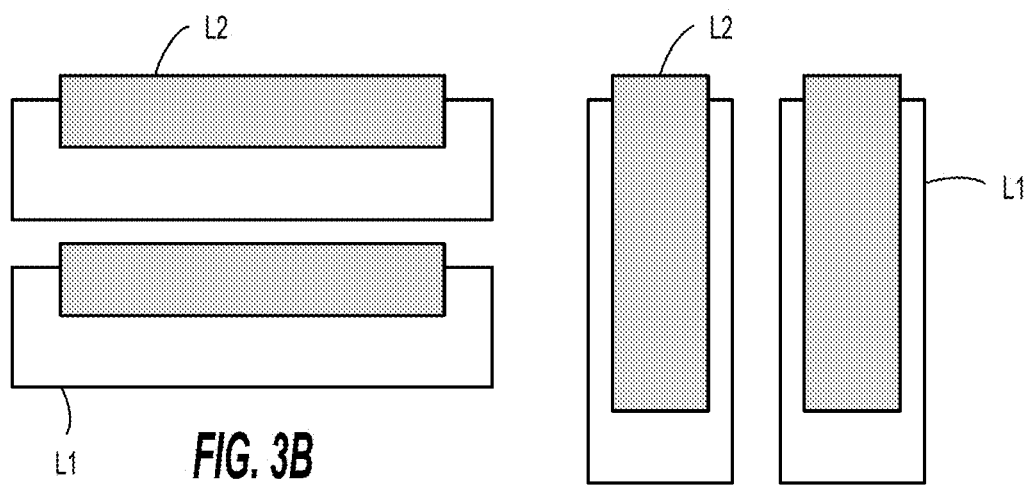
FIG. 3B illustrates alignment of two layers with wafer stress correction in X direction in accordance with some embodiments of the present disclosure.
Figure 3C:
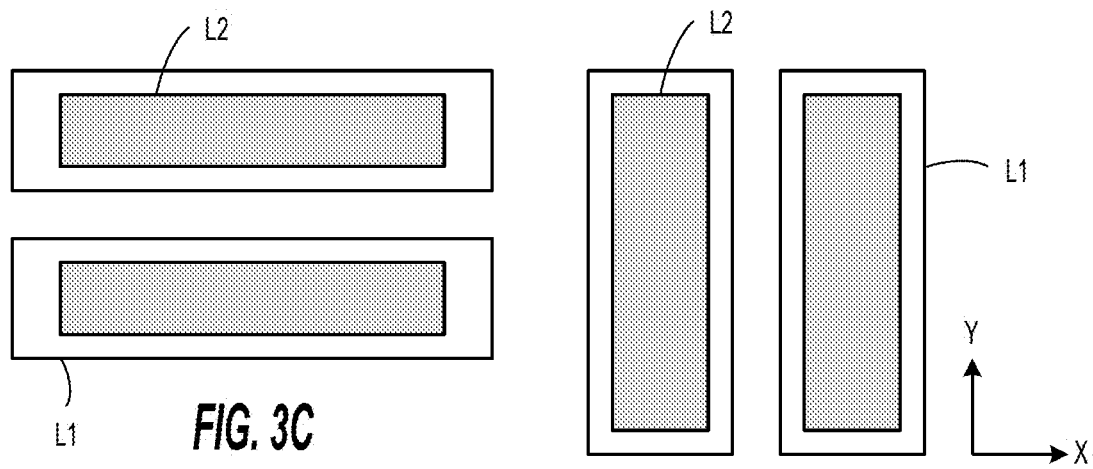
FIG. 3C illustrates further alignment of the layers shown in FIG. 3B with wafer stress correction in Y direction in accordance with some embodiments of the present disclosure.

FIG. 3A illustrates alignment of a layer L2 to a layer L1 without wafer stress correction. Note that there is misalignment in both X and Y directions. This is the problem to be solved. FIG. 3B illustrates alignment of the layer L2 to the layer L1 with wafer stress correction first in X direction in accordance with the present disclosure. Note that the layer L2 is aligned to the layer L1 in X direction correctly, but is still misaligned to the layer L1 in Y direction. FIG. 3C illustrates further alignment of the layer L2 to the layer L1 with wafer stress correction in Y direction in accordance with the present disclosure. Note that the layer L2 is also aligned to the layer L1 in Y direction. X and Y directions extend across a working surface of a wafer and are orthogonal to each other. Accordingly, the wafer stress is corrected and the layer L2 is aligned to the layer L1 in two steps.

Techniques disclosed herein use backside films stress modification and novel lithography integration.

Figure 4:
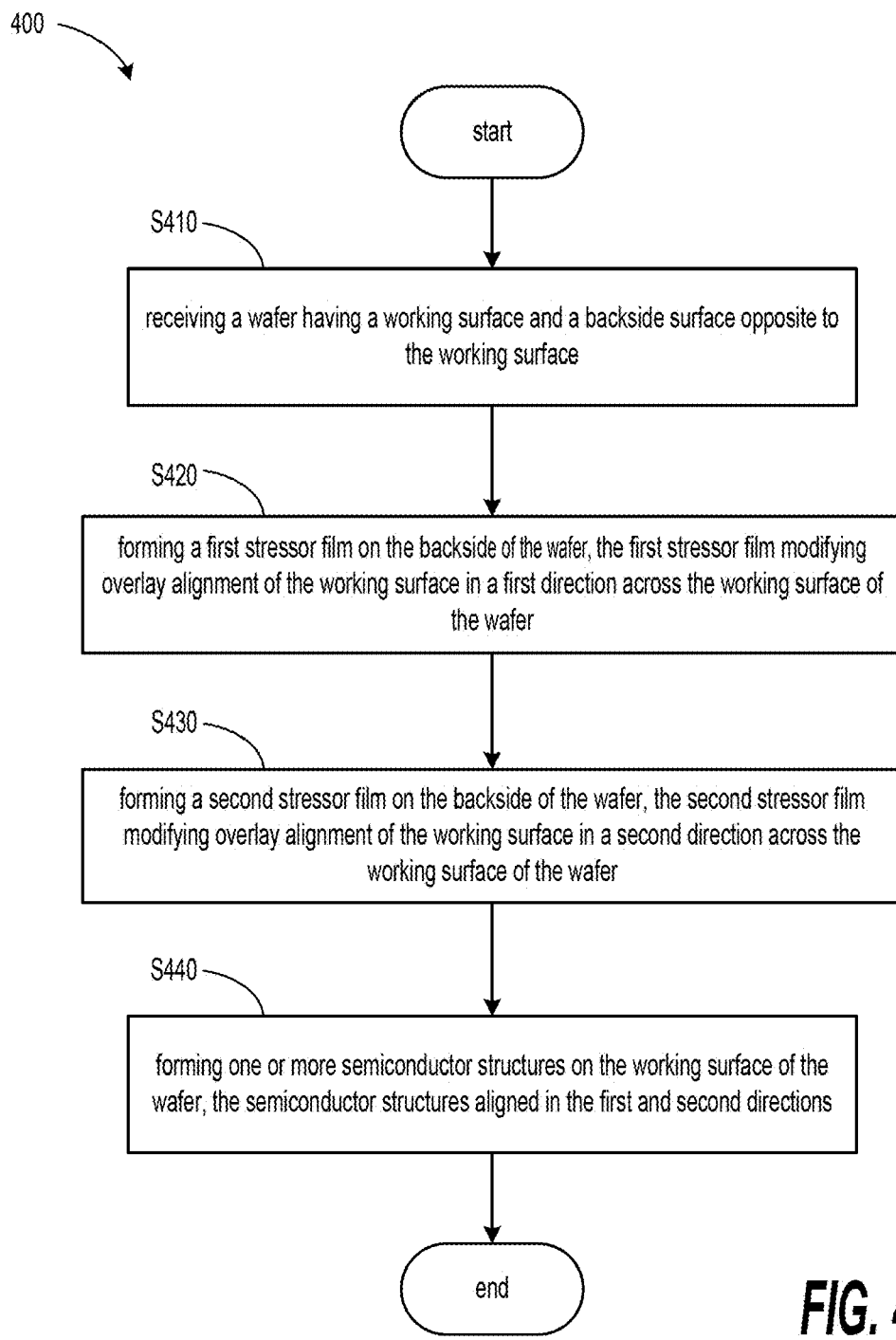
FIG. 4 is a flow chart illustrating an exemplary method for improving overlay alignment of patterning by correcting wafer shape in two directions in accordance with some embodiments of the present disclosure.

FIG. 4 is a flow chart illustrating an exemplary method 400 for improving overlay alignment of patterning by correcting wafer shape in two different axes in accordance with some embodiments of the present disclosure. For example, the method 400 can correct wafer bow and curvature in two or more independent directions to more accurately print patterns on a wafer. Accordingly, two masks may be used. Nevertheless, additional masking layers can be integrated with backside stressor films with wafer-shape correction tools. In an embodiment, the two or more independent directions can include X and Y directions. In another embodiment, the two or more independent directions can include a first direction and a second direction being rotated at least 15 degrees relative to the first direction, e.g., 45 degrees.

In general, one or more stressor films can be deposited on a backside surface of a wafer, which is opposite to a working surface where active devices are disposed. Then, a photoresist film can be deposited on the backside surface and patterned. Patterning can be done via a photomask and scanner, but preferably patterning is executed using direct-write laser exposure. Direct write is preferred because exposure patterns can be modified for or tailored to each individual wafer. For example, the shape of each wafer can be measured to create a wafer bow measurement. The wafer bow measurement can be, for example, a map of relative z-height variations across a wafer or other overlay misalignment measurement. After the photoresist formed on the backside surface is patterned and developed, the one or more stressor films can be etched. This modifies an internal stress of the wafer to result in a modified wafer shape, that, for example, improves overlay or flattens the wafer. The stressor films can have an initial internal stress which can be tensile or compressive. Selectively removing material from coordinate locations accordingly modifies the internal stress of the wafer.

Additional backside film correction techniques are introduced to induce/modify stresses, such as an epoxy film that has its internal stress changed in response to a pattern of light corresponding to particular locations of the epoxy film. Thus, stress modification can occur without etching needed. Accordingly, stressor films herein refer to any film formed on a backside surface of a wafer and treated to cause a stress modification to the wafer. This can include depositing one (or more) stressor film, such as a silicon oxide or silicon nitride film, coating the stressor film with a photoresist layer, exposing (e.g., direct-write) and developing the photoresist layer, etching the stressor film, and removing the photoresist layer. At this point, patterning on a working surface of the wafer can continue. Techniques herein have discovered that there are distinct advantages to incremental overlay correction. One discovery is that correcting alignment in one direction at a time can provide greater accuracy compared to correcting bow for all directions at once. Accordingly, techniques herein correct alignment in separate directions incrementally or successively. Techniques also include correction in one direction without correction in another direction, typically orthogonal.

The method 400 starts with step 410, at which a wafer is received that has a backside surface and a working surface opposite to the backside surface. The working surface may be with at least partially-fabricated devices, one or more microfabrication steps of which may result in a measure of wafer bow of the wafer. For example, layer L1 and layer L7 are formed on a working surface of a wafer, as shown in FIGS. 5A and 5B. It is desired to add a layer L11 at the indicated location (shown in dashed line), which is spaced from the layers L1 and L7 or aligned independent of layers L1 and L7 alignment.

At step S420, a first stressor film 510, shown in FIGS. 5A and 5B, is deposited and formed on the backside surface of the wafer. In an embodiment, the first stressor film 510 is used to modify overlay alignment of the working surface of the wafer in a first direction, e.g., X direction, across the working surface of the wafer, without any stress correction in Y direction. Accordingly, the first stressor film 510 targets the overlay alignment modification for one direction, e.g., X direction, without targeting for another direction e.g., Y direction, For example, the wafer, with the layers L1 and L7 formed on the working surface thereof, can be measured to identify an X-direction bow measurement of the wafer, and the first stressor film 510 can have its X-direction internal stress modified based on the X-direction bow measurement. In an embodiment, the first stressor film 510 is coated with a photoresist layer, the photoresist layer is patterned corresponding to the X-direction bow measurement and developed, the first stressor film 510 is etched using dry or wet etching, and the photoresist layer is then removed, so that the internal stress of the first stressor film 510 is modified to correspond to the X-direction bow measurement of the wafer, and, as a result, the wafer is close to being flat or considered flat in X direction. In another embodiment, the first stressor film 510 can be reactive to heat such that applied heat changes its internal, and a pattern of heat can be applied onto the first stressor film 510, the pattern of heat corresponding to the X-direction bow measurement. In some other embodiments, the first stressor film 510 can be reactive to a first wavelength of light in that exposure to the first wavelength of light changes its internal stress, and a pattern of the first wavelength of light can be generated to expose the first stressor film 510, the pattern of the first wavelength of light corresponding to the X-direction bow measurement. The first stressor film 510 thus formed is used to modify overlay alignment in the first direction, i.e., X direction, and includes no substantial or significant overlay alignment in a second direction, e.g., Y direction, that is different from or is orthogonal to the first direction.

Then, a photoresist layer L11x can be formed on the working surface of the wafer and aligned to the layers L1 in X direction. The photoresist layer L11x can be patterned, exposed and developed in a lithographic process to form a hardmask L11x, as shown in FIGS. 5C and 5D, and the wafer can be etched accordingly. Note that the hardmask L11x is formed and placed between the layers L1, with no alignment correction in Y direction performed. Accordingly, the hardmask L11x covers a portion of the layers L7. This may be acceptable depending on etch selectivities and patterning objectives. The hardmask L11x has been aligned in X direction, that is, without overlapping the L1 layers.

At step S430, a second stressor film 610, shown in FIGS. 6A and 6B, is deposited and formed on the backside surface of the wafer. In an embodiment, the second stressor film 610 is used to modify overlay alignment of the working surface of the wafer in a second direction, e.g., Y direction, across the working surface of the wafer, without any stress correction in X direction. Accordingly, the second stressor film 610 also targets the overlay alignment modification for one direction, e.g., Y direction, without targeting for another direction e.g., X direction, For example, the wafer, with the layers L1 and L7 formed on the working surface thereof and the first stressor film 510 formed on the backside surface thereof, can be measured to identify a Y-direction bow measurement of the wafer, and the second stressor film 610 can have its Y-direction internal stress modified based on the Y-direction bow measurement. In an embodiment, the second stressor film 610 is coated with a photoresist layer, the photoresist layer is patterned corresponding to the Y-direction bow measurement and developed, the second stressor film 610 is etched using dry or wet etching, and the photoresist layer is then removed, so that the internal stress of the second stressor film 610 is modified to correspond to the Y-direction bow measurement of the wafer, and the wafer is close to being flat or considered flat in Y direction. In another embodiment, the second stressor film 610 can be reactive to heat such that applied heat changes its internal or be reactive to a second wavelength of light in that exposure to the second wavelength of light changes its internal stress, and a pattern of heat is applied onto the second stressor film 610 or a pattern of the second wavelength of light is generated to expose the second stressor film 610, the pattern of heat and the pattern of the second wavelength of light corresponding to the Y-direction bow measurement. The second stressor film 610 thus formed is used to modify overlay alignment in the second direction, i.e., Y direction, and includes no substantial or significant overlay alignment in the first direction, e.g., X direction, which is different from or is orthogonal to the second direction.

Then, a photoresist layer Lily can be formed on the working surface of the wafer and aligned to the layers L7 in Y direction. The photoresist layer Lily can be patterned, exposed and developed in a lithographic process to form the hardmask L11, as shown in FIGS. 6C and 6D, and the wafer can be etched accordingly. Note that the hardmask L11 is formed and placed between the layers L1 and between the layers L7, and is aligned in X and Y directions, without overlapping the layers L1 and L7.

In an embodiment, the first stressor film 510 can be removed in selective regions of the backside surface of the wafer before the second stressor film 610 is formed. Stress memorization can also be used herein. In some embodiments, even though the first stressor film 510 is removed, the semiconductor lattice still has a memory effect because the stress of the first stressor film 510 has been transferred to the silicon lattice of the wafer.

In some embodiments, the second stressor film 610 and the first stressor film 510 can be formed in a double patterning lithography process. For example, in a litho-etch-litho-etch (LELE) process the second stressor film 610 and the first stressor film 510 are formed on a backside surface of a wafer 710, and a first resist layer 720 is coated on the first stressor film 510 and patterned corresponding to the X-direction bow measurement, as shown in FIG. 7A. The first stressor film 510 is etched, as shown in FIG. 7B. The first resist layer 720 is stripped, and a second resist layer 730 is coated on the second stressor film 610 and patterned corresponding to the Y-direction bow measurement, as shown in FIG. 7C. The second stressor film 610 is etched, and the second resist layer 730 is stripper, as shown in FIG. 7D. In the LELE process, two lithography steps and two etch steps are performed. As another example, in a litho-freeze-litho-etch (LFLE) process the first resist layer 720 is coated on the second stressor film 610 and patterned corresponding to the X-direction bow measurement, as shown in FIG. 8A, and the patterned first resist layer 720 is frozen using a chemical treatment, as shown in FIG. 8B. The second resist layer 730 is coated on the second stressor film 610 and patterned corresponding to the Y-direction bow measurement, as shown in FIG. 8C. The second stressor film 610 is etched that has its internal stress modified and corresponding to the X-direction and Y-direction bow measurements, and the first resist layer 720 and the second resist layer 730 are stripped, as shown in FIG. 8D. In the LFLE process, two lithography steps and only one etch steps are performed. The first stressor film 510 and the second stressor film 610 can also formed in a litho-cure-litho-etch (LCLE) process, in which the patterned first resist layer 730 is baked, instead of being frozen using the chemical treatment.

At step S440, one or more semiconductor devices, e.g., the layer L11, can be formed on the working surface of the wafer. As the wafer bow of the wafer in the first and second directions is modified and the wafer is close to being flat or considered flat in X and Y directions, the semiconductor devices can be aligned in X and Y directions.

Figure 9A:
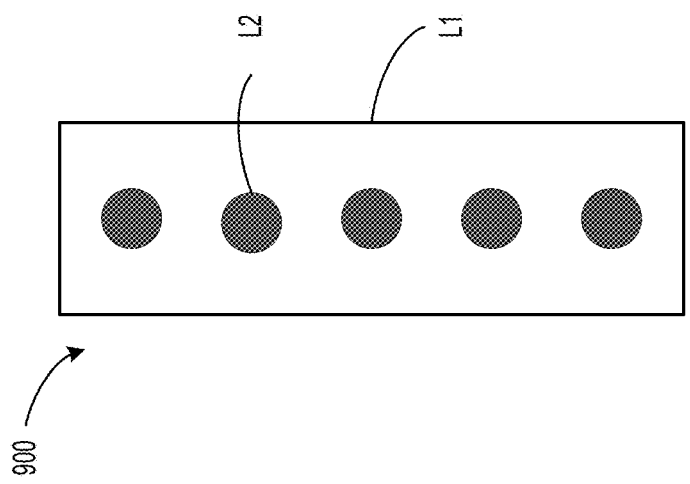
FIGS. 9A to 9C illustrate correcting wafer bow and curvature in only X direction in accordance with some embodiments of the present disclosure.
Figure 9B:
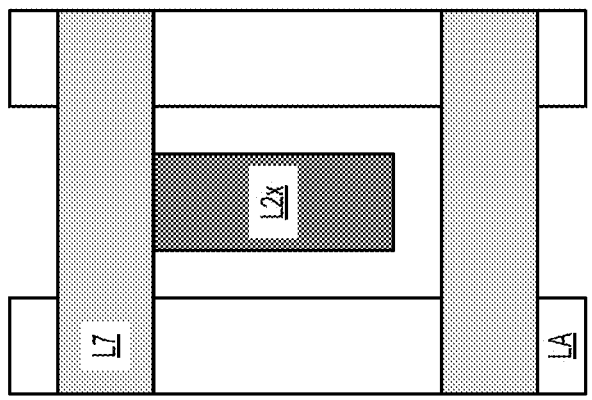
Figure 9C:
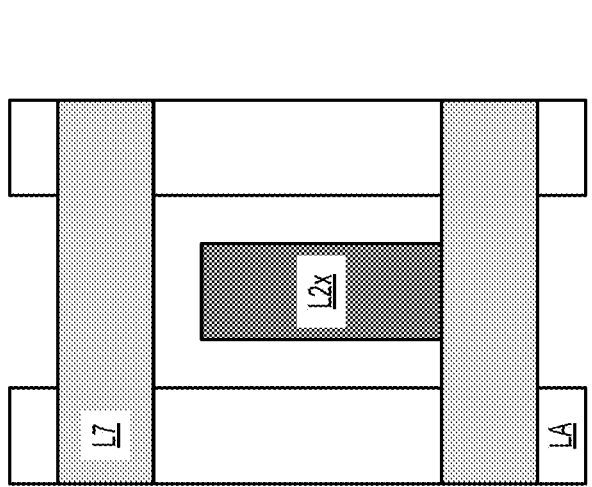
Figure 10A:
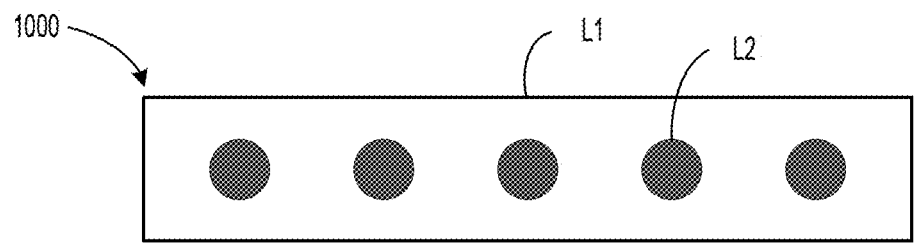
FIGS. 10A to 10C illustrate correcting wafer bow and curvature in only Y direction in accordance with some embodiments of the present disclosure.
Figure 10B:
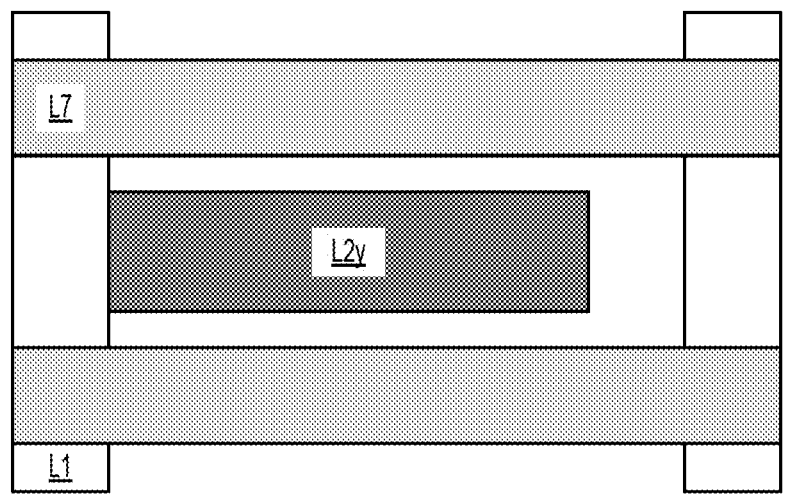
Figure 10C:
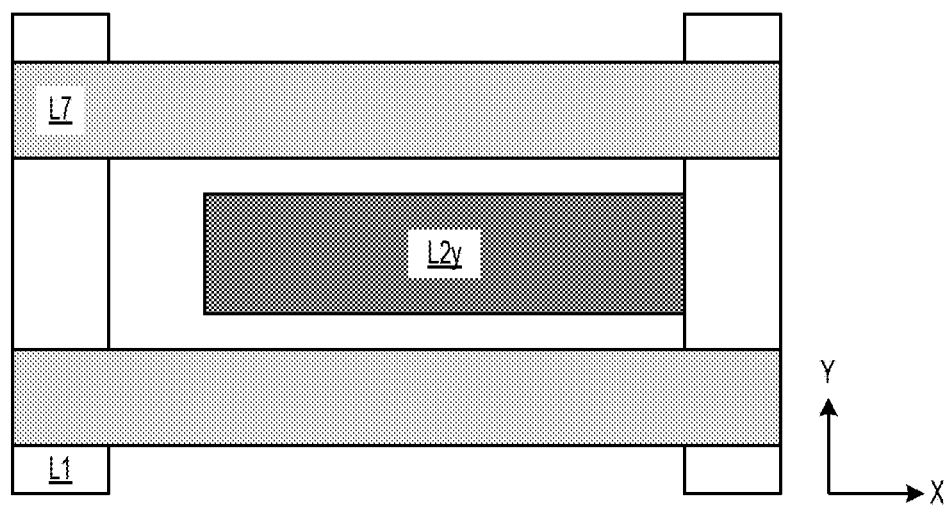

Embodiments herein also include single axis or single direction correction at a time. Some embodiments include alignment correction in only one direction when sufficient for desired microfabrication applications. For example, in some microfabrication steps there may be certain features that only have an X-direction alignment dependence or Y-direction alignment dependence. These features would not need a cut mask approach and could be segregated on X mask and Y mask, respectively. An example with vias 900 is shown in FIG. 9A, which illustrates that a layer L2 that has vias disposed in Y direction is formed on a layer L1 that has metal signal wires. The X-direction critical vias of the layer L2 could be on a hardmask L2x, as shown in FIGS. 9B and 9C. Another example with vias 1000 is shown in FIG. 10A, which illustrates that a layer L2 that has vias disposed in X direction is formed on a layer L1 that has metal signal wires. The Y-direction critical vias of the layer L2 could be on a hardmask L2y, as shown in FIGS. 10B and 10C.

Figure 11:
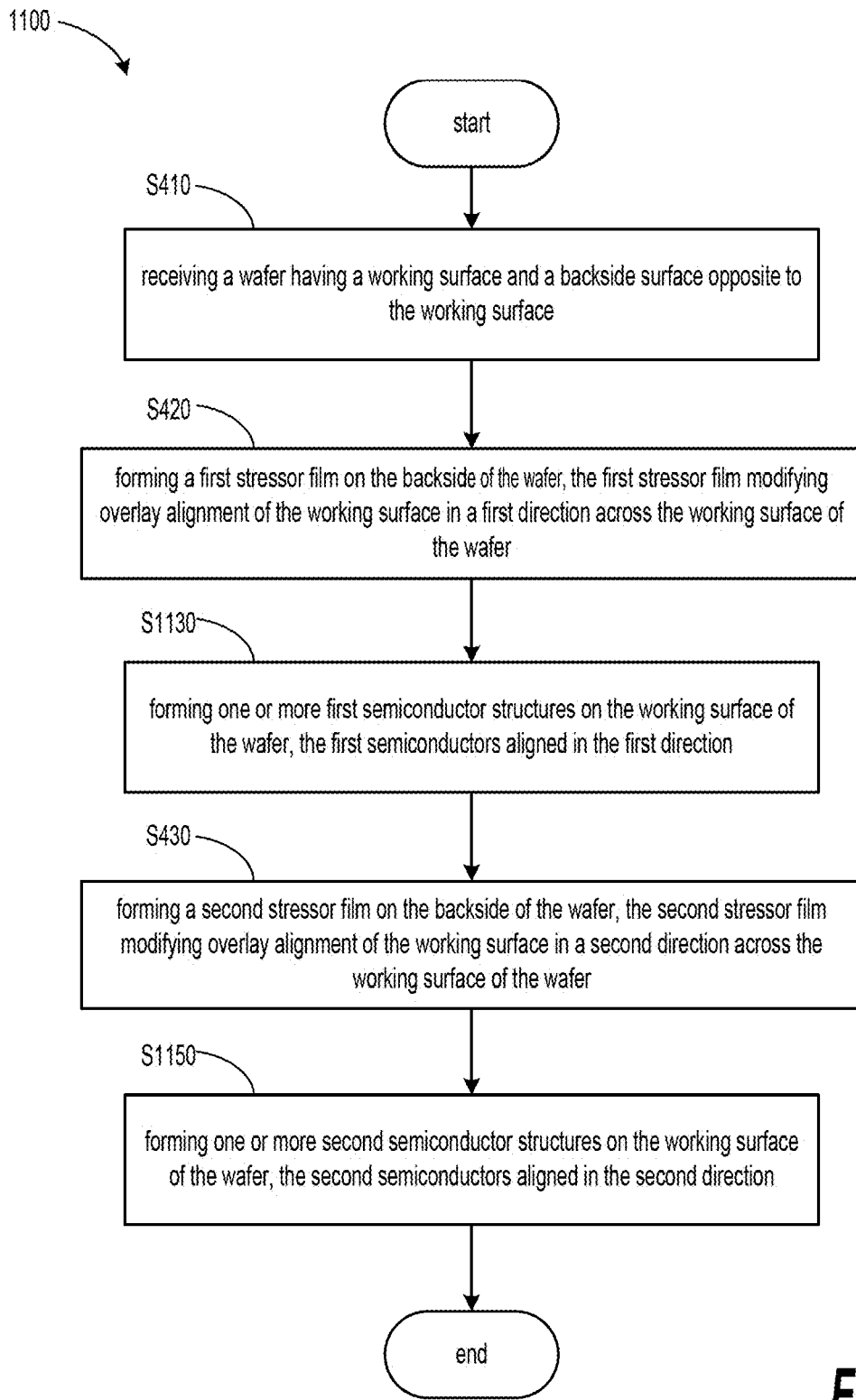
FIG. 11 is a flow chart illustrating an exemplary method for improving overlay alignment of patterning by correcting wafer shape in a single axis in accordance with some embodiments of the present disclosure.

FIG. 11 is a flow chart illustrating an exemplary method 1100 for improving overlay alignment of patterning by correcting wafer shape in a single axis in accordance with some embodiments of the present disclosure. For example, the method 1100 can correct wafer bow and curvature in a single axis, as described in accordance with FIGS. 9A to 9C and FIGS. 10A to 10C. The method 1100 starts with step 410, followed by step S420, in which the first stressor film 510 is formed and patterned on the backside surface of the wafer to modify overlay alignment of the working surface of the wafer in a first direction, e.g., X direction. At step S1130, one or more first semiconductor devices, e.g., the vias 900 or the layer L2x, can be formed on the working surface of the wafer. As the wafer bow of the wafer in the first direction is modified and the wafer is close to being flat or considered flat in X direction, the first semiconductor devices can be aligned in X direction. The method 1100 can then execute step S430, in which the second stressor film 610 is formed and patterned on the backside surface of the wafer to modify overlay alignment of the working surface of the wafer in a second direction, e.g., Y direction. At step S1150, one or more second semiconductor devices, e.g., the vias 1000 or the layer L2y, can be formed on the working surface of the wafer. As the wafer bow of the wafer in the second direction is modified and the wafer is close to being flat or considered flat in Y direction, the second semiconductor devices can be aligned in Y direction.

Some embodiments can include average X and Y correction. Layers can be L1 to Ln (n is 1 to ~300). For example, an alignment tree is prepared: L1→L7→L11, and layers L1 and L7 have already been patterned. Ideally, wafer shape for a hardmask L11x is L1, while wafer shape for a hardmask L11y is L7. In an embodiment, wafer shape of L11=$\alpha$L1+ (1−$\alpha$)L7, where 0≤$\alpha$≤1. For example, $\alpha$=½ and L11=(L1+ L7)/2. The advantage is that this process is less costly with less processing (one stressor film). FIGS. 12A to 12D illustrate an example result. Note that the layer L11 is aligned within the layers L1 and L7, but with less precision compared to incremental correction and placement. This alignment correction is still better than using no stressor film.

Figure 13:
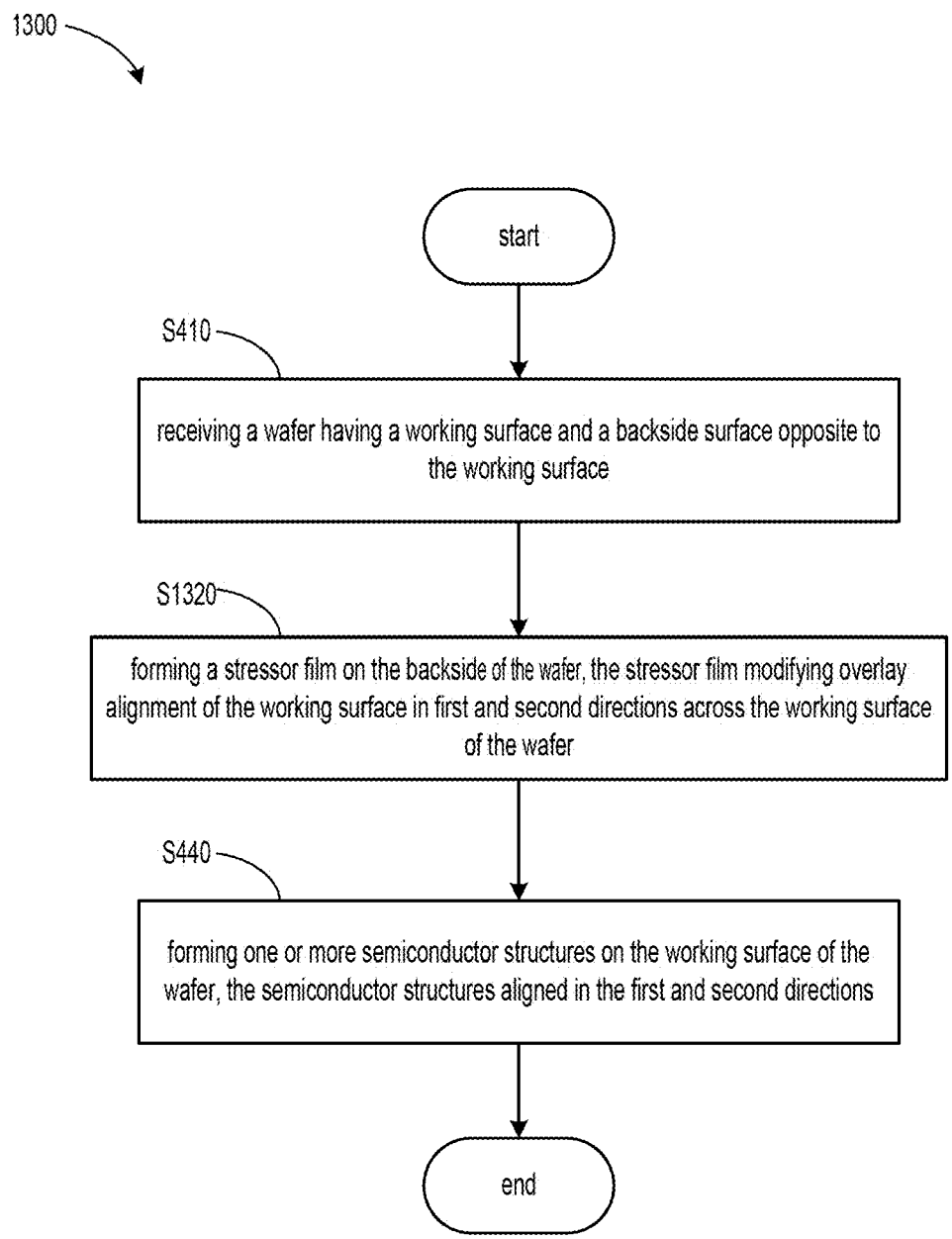
FIG. 13 is a flow chart illustrating an exemplary method for improving overlay alignment of patterning by correcting wafer shape in accordance with some embodiments of the present disclosure.

FIG. 13 is a flow chart illustrating an exemplary method 1300 for improving overlay alignment of patterning by correcting wafer shape, in accordance with some embodiments of the present disclosure. For example, the method 1300 can include average X and Y correction in wafer bow and curvature, as described in accordance with FIGS. 12A to 12D. The method 1300 starts with step 410. At step S1320, a stressor film is deposited and formed on the backside surface of the wafer. In an embodiment, the stressor film is used to modify overlay alignment of the working surface of the wafer in an average of first and second directions, e.g., X and Y directions, across the working surface of the wafer. For example, the wafer, with the layers L1 and L7 formed on the working surface thereof, can be measured to identify X-direction and Y-direction bow measurements of the wafer, and the stressor film can have its X-direction and Y-direction internal stresses modified based on the X-direction and Y-direction bow measurements. For example, the stressor film can have its X-direction and Y-direction internal stresses modified based on $\alpha$ times of the X-direction bow measurement and (1−$\alpha$) times of the Y-direction bow measurement, where 0≤$\alpha$≤1, e.g., $\alpha$=½. The method 1300 can also include step S440, in which one or more semiconductor devices, e.g., the layer L11, can be formed on the working surface of the wafer. As the wafer bow of the wafer in the first and second directions is modified and the wafer becomes flatter in X and Y directions, as compared with the wafer without the stressor film formed on the backside surface thereof, the semiconductor devices can be aligned in X and Y directions.

In another example embodiment, in the A,H,Z example another way to approach the Zx Zy challenge is to preemptively ensure the shape of A and H match. Suppose H has a relatively large overlay budget and it would be an easy application of a wafer shape correction tool to manipulate wafer shape to match A. That way when it is time to do layer Z, there is a best Zx→A and Zy→H overlay. Even if H doesn't have a large overlay budget, co-optimization could still take place to match A while staying within budget to make wafer tool correction at Z easier. In the flow described above, A and H are interchangeable. If A has more flexibility its shape can be made to look like H in advance using feedback from a previous lot run.

The precision multi-axis nature disclosed herein is in part understood from photolithography exposure practices. When exposing at the limit of resolution of a given photolithography system, shapes are often easier to print when exposed as lines. As such, multiple exposures can be executed to print lines in different directions. Of course, lithographic exposure is distinct from stress correction, but stress modification can be improved herein by separating directional stress modification into components. For example, X direction correction and application is followed by Y direction correction and application. Some transistor designs can have feature shifts of 45 degrees, thus a third alignment modification can be executed as well as a fourth alignment modification, fifth alignment modification, and so on. Accordingly, by separating backside alignment correction into component directions, improved precision and accuracy of aligned patterning is realized.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A method, comprising:
   receiving a wafer having a working surface with a first layer and a second layer formed thereon, and a backside surface opposite to the working surface, a target layer to be formed on the working surface that is aligned with the first layer in a first direction and aligned with the second layer in a second direction different from the first direction;
   measuring the wafer, with the first layer and the second layer formed on the working surface, to identify a first bow measurement in the first direction;
   forming a first stressor film on the backside surface and modifying an internal stress of the first stressor film in the first direction based on the first bow measurement, the first stressor film modifying overlay alignment of the working surface in the first direction across the working surface of the wafer and including no overlay alignment in the second direction across the working surface of the wafer;
   forming a first photoresist layer on the working surface that is aligned with the first layer in the first direction;
   performing a first lithographic process on the first photoresist layer to form an intermediate hardmask;
   measuring the wafer, with the first layer, the second layer and the intermediate hardmask formed on the working surface and the first stressor film formed on the backside surface, to identify a second bow measurement in the second direction;
   forming a second stressor film on the backside surface and modifying an internal stress of the second stressor film in the second direction based on the second bow measurement, the second stressor film modifying, overlay alignment of the working surface in the second direction across the working surface of the wafer and including no overlay alignment in the first direction across the working surface of the wafer;
   forming a second photoresist layer on the working surface that is aligned with the second layer in the second direction and covers the intermediate hardmask;
   performing a second lithographic process on the second photoresist layer and the intermediate hardmask to form a target hardmask; and
   performing a target lithographic process on the working surface to form the target layer.

2. The method of claim 1, wherein the second direction is rotated at least 15 degrees relative to the first direction.

3. The method of claim 2, wherein the second direction is rotated 45 degrees relative to the first direction.

4. The method of claim 2, wherein the second direction is orthogonal to the first direction.

5. The method of claim 1, further comprising:
   subsequent to performing the first lithographic process on the first photoresist layer to form the intermediate hardmask, forming one or more first semiconductor structures on the working surface of the wafer, the first semiconductor structures aligned in the first direction.

6. The method of claim 5, wherein the first stressor film and the second stressor film are formed in a litho-etch-litho-etch (LELE) process or a litho-freeze-litho-etch (LFLE) process.

7. The method of claim 1, wherein the first stressor film is formed using direct write patterning.

* * * * *

UNITED STATES PATENT AND TRADEMARK OFFICE
CERTIFICATE OF CORRECTION

| | |
|---|---|
| PATENT NO. | : 12,001,147 B2 |
| APPLICATION NO. | : 17/888553 |
| DATED | : June 4, 2024 |
| INVENTOR(S) | : Fulford et al. |

It is certified that error appears in the above-identified patent and that said Letters Patent is hereby corrected as shown below:

In the Claims

In Column 12, Claim 1, Line 30, delete "modifying," and insert -- modifying --, therefor.

Signed and Sealed this
Twentieth Day of August, 2024

Katherine Kelly Vidal
*Director of the United States Patent and Trademark Office*